(12) United States Patent  
Knowles et al.

(10) Patent No.: US 7,511,704 B2  
(45) Date of Patent: Mar. 31, 2009

(54) ACOUSTIC WAVE TOUCH BAR SYSTEM AND METHOD OF USE

(75) Inventors: Terence J. Knowles, Barrington, IL (US); Wayne J. Wehrer, Austin, TX (US); Charles F. Bremigan, III, Jarrell, TX (US)

(73) Assignee: Illinois Tool Works Inc., Glenview, IL (US)

( * ) Notice: Subject to any disclaimer, the term of this patent is extended or adjusted under 35 U.S.C. 154(b) by 812 days.

(21) Appl. No.: 11/187,446

(22) Filed: Jul. 22, 2005

(65) Prior Publication Data

US 2006/0012583 A1    Jan. 19, 2006

Related U.S. Application Data

(63) Continuation-in-part of application No. 09/998,355, filed on Nov. 20, 2001, now Pat. No. 7,106,310, and a continuation-in-part of application No. 10/245,246, filed on Sep. 17, 2002, now Pat. No. 6,933,932, and a continuation-in-part of application No. 10/454,003, filed on Jun. 4, 2003, now Pat. No. 7,265,746.

(51) Int. Cl.  
*G09G 5/00* (2006.01)

(52) U.S. Cl. .................................. 345/177; 345/176

(58) Field of Classification Search ......... 345/156–173, 345/174–177; 178/18.01, 18.04, 18.05, 19.05, 178/19.06  
See application file for complete search history.

(56) References Cited

U.S. PATENT DOCUMENTS

| | | | |
|---|---|---|---|
| 4,645,870 A | 2/1987 | Adler | |
| 4,700,176 A | 10/1987 | Adler | |
| 5,149,986 A | 9/1992 | Jalbert | |
| 5,177,327 A | 1/1993 | Knowles | |
| 5,573,077 A | 11/1996 | Knowles | |
| 5,673,041 A | 9/1997 | Chatigny et al. | |
| 5,813,280 A | 9/1998 | Johnson et al. | |
| 6,078,315 A * | 6/2000 | Huang | 345/177 |
| 6,723,929 B2 * | 4/2004 | Kent | 178/18.04 |

(Continued)

OTHER PUBLICATIONS

International Search Report corresponding to International Application Serial No. PCT/US2006/028337, mailed Jun. 30, 2008, 2 pages.

(Continued)

*Primary Examiner*—Nitin Patel  
(74) *Attorney, Agent, or Firm*—McAndrews, Held and Malloy, Ltd.

(57) ABSTRACT

Certain embodiments provide an acoustic wave touch bar system and method of use. Certain embodiments include a bar having two portions of reduced cross-section forming an acoustic cavity in the portion of the bar between the reduced cross-sections. The system includes an acoustic wave transducer positioned on the acoustic wave cavity, wherein the transducer generates an acoustic standing wave that is substantially trapped in the acoustic cavity. The system also includes a circuit coupled to the transducer and responsive to a change in an output of the transducer to detect a touch on a touch surface of the bar. The circuit may be a programmable and/or adaptive circuit, for example. The circuit may detect a change in an exponentially decaying response of the transducer indicating that the touch surface of the bar has been touched.

32 Claims, 8 Drawing Sheets

U.S. PATENT DOCUMENTS

2003/0216817 A1 * 11/2003 Pudney .................. 700/17
2004/0246239 A1 * 12/2004 Knowles et al. ............ 345/177
2007/0179379 A1 * 8/2007 Weng et al. ............. 600/424
2008/0024314 A1   1/2008 Hill et al.

OTHER PUBLICATIONS

Written Opinion of the International Searching Authority corresponding to International Application Serial No. PCT/US2006/028337, mailed Jun. 30, 2008, 5 pages.

* cited by examiner

ACOUSTIC WAVE TOUCH BAR SYSTEM AND METHOD OF USE

CROSS-REFERENCE TO RELATED APPLICATIONS

This application is a continuation in part of the following patent applications: U.S. patent application entitled "Acoustic Wave Touch Actuated Switch," Ser. No. 09/998,355, filed Nov. 20, 2001 now U.S. Pat. No. 7,106,310; U.S. patent application entitled "Acoustic Wave Sensor With EMAT Drive," Ser. No. 10/245,246, filed Sep. 17, 2002 now U.S. Pat. No. 6,933,932; and U.S. patent application entitled "Acoustic Wave Touch Detection Circuit and Method," Ser. No. 10/454,003 filed Jun. 4, 2003 now U.S Pat. No.7,265,746, all of which are herein incorporated by reference in their entirety.

STATEMENT REGARDING FEDERALLY SPONSORED RESEARCH OR DEVELOPMENT

N/A

BACKGROUND OF THE INVENTION

This invention relates to an acoustic wave touch bar, and more particularly relates to an acoustic wave touch bar system having an acoustic cavity that substantially traps acoustic wave energy so as to provide a high Q switch.

There is a substantial need for finger touch actuated switches that are rugged and explosion proof, operate in the presence of liquids, have low power consumption, withstand aggressive sterilization procedures and are inexpensive. Known switches that attempt to meet these needs but fail include the following. A Qprox switch made by Quantum Research Group senses the presence of touch through a charge transfer effect. This switch is sensitive to conductive fluids and/or an ionizing atmosphere and can be made inoperable thereby. Further, the enclosure through which touch is sensed cannot be made of an electrically conducting material, so that metals and the like cannot be used. Piezoelectric switches such as supplied by Schurter or Baran, operate by transferring finger pressure via a metal overlay to a piezoelectric element which generates a voltage when compressed. This type of switch is expensive compared to a standard membrane switch and shares the disadvantages of membrane switches in that holes in the housing or enclosure are required to accommodate the switch. Further, the metal overlay is necessarily thin, so that the piezoelectric element is relatively unprotected against impacts to the overlay. Another type of switch shown in U.S. Pat. No. 5,149,986 is based on the absorption of sound in a glass, ball-shaped button when the button is touched. In operation, a transducer sends sound waves into the glass balls and then receives back the echoes in a sonar type fashion. A circuit analyzes the echoes to determine whether the echoes have been reduced indicating a touch. This type of switch is relatively expensive and again requires openings in the housing or enclosure in which the switch is to be mounted.

An acoustic wave switch such as shown in U.S. Pat. No. 5,673,041 includes an ultrasonic piezoelectric transducer mounted on a surface of a substrate opposite a touch surface of the substrate. The transducer generates an ultrasonic wave that propagates in a direction across the thickness of the substrate to the touch surface and reflects off of the touch surface back to the transducer. The ultrasonic wave appears to be a compressional wave. A touch on the touch surface changes the acoustic reflectivity of the surface and changes the impedance of the transducer. The acoustic energy in this switch is not confined and spreads out into the plane of the substrate. As such, the ratio of the stored energy to lost or dissipated energy over a complete cycle, referred to as the Q of the switch, is inherently low and an extremely complex touch detection circuit is required to discriminate between a touch and the absence of a touch. Moreover, the use of compressional waves in this switch is undesirable due to their sensitivity to liquids and other contaminants which can render the switch inoperable.

Also known are acoustic wave touch panels that employ reflective gratings or arrays to reflect portions of an acoustic wave across a touch surface along parallel paths of differing lengths. These devices use a transparent substrate that can overlay a display to provide a touch screen or the like. Examples of such touch sensors are shown in U.S. Pat. Nos. 4,645,870 and 4,700,176 which utilize surface acoustic waves. These systems are undesirable, however, because surface acoustic waves are sensitive to liquids, sealing compounds and other contaminants that can render the panel inoperable and difficult to seal effectively. Another acoustic wave touch panel using reflective arrays is shown in U.S. Pat. No. 5,177,327. This touch panel uses shear waves and in particular the zeroth order horizontally polarized shear wave. Although this touch position sensor is insensitive to liquids and contaminants, touch position sensors that use reflective gratings or arrays and the associated touch detection circuitry are, in general, too expensive to use for an individual switch or for a small number of switches on a panel. Moreover, because the shear wave transducer in this latter system is mounted on a side of the panel to generate a shear wave that propagates in the plane of the substrate, an opening in the enclosure or housing is required to accommodate the panel. U.S. Pat. No. 5,573,077 also uses zeroth order horizontally polarized shear waves, but instead of reflective gratings, discrete transducers are used to propagate the shear waves along parallel paths extending across the substrate.

An acoustic wave switch that overcomes the above problems utilizes an acoustic wave cavity and an acoustic wave transducer to generate a resonant acoustic wave that is substantially trapped in the cavity as disclosed in U.S. patent application Ser. No. 09/998,355 filed Nov. 20, 2001. As discussed therein, an analog touch detection circuit includes an oscillator coupled to the acoustic wave transducer wherein the oscillator is configured to oscillate in the absence of a touch. A touch on the touch surface of the acoustic wave cavity causes the transducer impedance to drop so that the oscillator stops oscillating. The state of the oscillator is determined and when the oscillator stops oscillating, a touch is detected. This circuit operates very well to detect a finger touch and a touch by a leather glove, for example. However, because it is desirable to detect a touch by contact of a synthetic blend glove, or the like, with the touch responsive area of the acoustic wave cavity and at the same time to not detect a touch when water alone contacts the touch responsive area, the sensitivity level of this touch detection circuit must be set within very narrow limits to meet these two competing requirements. As a result, small changes in the transducer impedance over time and/or with variations in temperature can result in a change in sensitivity that is outside of the requisite limits of the circuit.

Further, there is a need for a simple circuit that is not affected by drift for detecting sensed events in acoustic wave sensors other than touch detection sensors.

Additionally, there is a need for a touch-sensitive tube, cylinder, rod or bar that is rugged and explosion proof, operates in the presence of liquids, has a low power consumption, withstands aggressive sterilization procedures and is inexpensive. There is a need for a bar, tube or other handle that may be used to trigger functionality based on touch, including both a finger touch and a gloved touch, for example. As discussed above, current systems have attempted to meet those needs but have failed. An acoustic resonator described in U.S. Pat. No. 5,813,280, issued on Sep. 29, 1998, is a force sensor designed to detect axial stress and torque applied to distal ends of the cylinder. The force sensor is used to determine the amount of force applied to a load-bearing element in a mechanical system. Electromagnetic acoustic transducers (or EMATs) with non-contacting electromagnetic coupling mechanisms are used to excite and detect selected resonant modes in a central section of the cylinder. For example, coiled EMATs wrapped around the central section of the cylinder are used to excite and detect selected resonant modes. Force is applied to the cylinder via couplings at each end of the cylinder to alter the resonant frequencies of the selected modes. The cylinder sensor relies on the non-contact insulated nature of the EMATs and contact at the ends of the cylinder to measure force applied at the distal ends of the cylindrical body. However, the sensor does not detect touch applied to the primary surface or central section of the cylinder.

Thus, there is a need for an improved acoustic wave touch bar system and method of use.

BRIEF SUMMARY OF THE INVENTION

Certain embodiments provide an acoustic wave touch bar system and method of use. Certain embodiments of an acoustic wave touch bar system include a bar including an acoustic cavity formed therein such that the mass per unit area of the acoustic cavity is greater than the mass per unit area of a portion of the bar adjacent the cavity and a surface of the acoustic cavity forming a touch surface for actuating the touch bar system, and an acoustic wave transducer positioned in the acoustic wave cavity, wherein the transducer generates an acoustic wave that is substantially trapped in the acoustic cavity, and wherein a touch on the touch surface of the cavity produces a detectable change in the impedance of the transducer.

In an embodiment, the acoustic wave generated in the bar creates a standing wave in the bar. The acoustic wave may be a torsional wave or other such wave, for example. The transducer may be an electromagnetic acoustic transducer, a piezoelectric transducer, or other transducer, for example.

In an embodiment, the bar includes at least two portions having reduced cross-sections forming the acoustic cavity. The transducer may be affixed or otherwise positioned with respect to the bar in the acoustic cavity. The bar may be an electrostrictive or magnetostrictive bar or other material, for example. The bar may be a push bar, for example. The bar may be formed of a metal or a ceramic material, for example. In an embodiment, at least a portion of the acoustic cavity is an integral part of the bar. The system may also include a flange or connector for coupling the bar to a surface, for example.

In an embodiment, the system includes a touch detection circuit connected to the transducer. The touch detection circuit may include a programmable microprocessor, for example. In an embodiment, the microprocessor is capable of dynamically recalibrating the acoustic wave touch bar system.

Certain embodiments of an acoustic wave touch bar system include a bar, which includes two portions of reduced cross-section forming an acoustic cavity in the portion of the bar between the reduced cross-sections. The system includes an acoustic wave transducer positioned on the acoustic wave cavity portion of the bar, wherein the transducer generates an acoustic wave that is substantially trapped in the acoustic cavity. The system also includes a circuit coupled to the transducer and responsive to a change in an output of the transducer to detect a touch on a touch surface of the bar.

In an embodiment, the acoustic wave generated by the transducer creates a standing wave in the bar. The circuit may detect a change in an output of the transducer indicating that the touch surface of the bar has been touched. In an embodiment, the circuit is an oscillator circuit that oscillates in the absence of a touch on the touch surface of the bar, and oscillation is reduced in response to a touch on the touch surface of the bar. The circuit may be a programmable circuit, for example. The circuit may be an adaptive circuit dynamically adapting to a change in at least one of an application, an environment, and the characteristic of the transducer, for example. In an embodiment, the circuit is responsive to the acoustic wave to determine a number representing a period of time that the acoustic wave for a sampling interval decays to a predetermined level, and the circuit compares the number for the sampling interval to a touch reference to detect a presence of a touch on the bar during the sampling interval. The circuit may include a processor and a memory, wherein the predetermined level is programmable, and the processor determines the touch reference, for example.

In an embodiment, at least a portion of the acoustic cavity is an integral part of the bar. In an embodiment, the bar is formed from a magnetostrictive material, an electrostrictive material, and/or other material, for example. In an embodiment, the acoustic wave is a standing wave.

Certain embodiments of a method for detecting a touch on a touch responsive bar include forming two areas of reduced cross-section in the bar, creating an acoustic wave cavity in the bar between the two areas of reduced cross-section, creating an indentation in the acoustic wave cavity portion of the bar, positioning a transducer in the indentation to generate an acoustic standing wave in the acoustic wave cavity, and providing a touch detection signal based on a change in an output of the transducer to detect a touch on the bar.

Certain embodiments of a method for detecting a touch on a touch responsive bar include generating a standing acoustic wave in a touch responsive portion of the bar, determining a value representing the time that the acoustic wave in the touch responsive portion decays to a predetermined level in an absence of a touch, comparing the value to a reference to determine whether the subsequent value represents a touch on the touch responsive portion of the bar, and generating a signal indicating a touch on the touch responsive portion of the bar.

In an embodiment, the method includes self-diagnostic capability to improve operation of the touch responsive bar. In an embodiment, the method also includes updating the reference used to detect a touch. The reference may be updated if the value does not represent a touch, for example. The reference may be updated if the value does not represent a touch and the value is different than the reference, for example. In an embodiment, the touch reference is determined based on at least one number representing a period of time that the acoustic wave signal for a sampling interval decays to a predetermined level in an absence of a touch on the touch responsive area of the bar. In an embodiment, an amplitude of the acoustic wave is compared to a predetermined amplitude to generate a pulse when the amplitude of the acoustic wave is less than the predetermined amplitude.

DETAILED DESCRIPTION OF THE INVENTION

Figure 1:
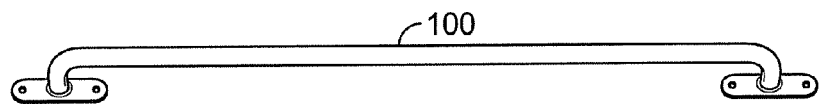
FIG. 1 illustrates a touch sensitive bar used in accordance with an embodiment of the present invention.

FIG. 1 illustrates a touch sensitive bar 100 used in accordance with an embodiment of the present invention. The bar 100 may be formed as a hollow or solid rod, tube or cylinder, for example. The bar 100 may also have a non-circular cross-section, such as an elliptical or rectangular cross-section. If the bar 100 is constructed as a tube, the tube may include a channel or passage through the interior of the tube. For example, the tube may include a curved (e.g., circular or oval) passage or a straight (i.e., rectangular, square or trapezoidal) passage. The bar 100 may be formed from a metal, such as stainless steel or aluminum, a ceramic, or similar substance. In an embodiment, the bar 100 may be a metal tube formed of magnetostrictive metal (e.g., dimensions of the metal change when a magnetic field is introduced), electrostrictive metal (e.g., dimensions of the metal change when an electric field is introduced), and/or other material, for example. The bar 100 may be formed at a variety of thicknesses and/or diameters (e.g., 100 mm), depending upon application.

An acoustic cavity is formed in the bar 100 by forming two areas or portions of reduced cross-section in the bar 100. The bar 100 may be sensitive to bare skinned or gloved touch, for example. The bar 100 may be a moveable push bar or a fixed bar, for example. The bar 100 may be positioned vertically and/or horizontally on a surface. For example, the bar 100 may be a three feet long, one inch diameter bar vertically mounted on bus and train doors. The bar 100 may be embedded in and/or protrude from a surface, for example.

Figure 2:
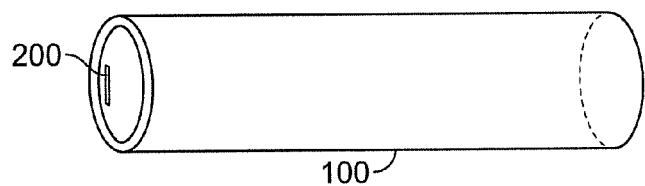
FIG. 2 shows a side view of a transducer positioned with respect to a touch sensitive bar in accordance with an embodiment of the present invention.
Figure 3:
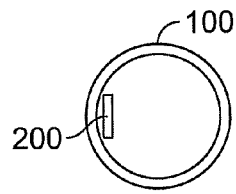
FIG. 3 depicts an end view of a transducer positioned with respect to a touch sensitive bar in accordance with an embodiment of the present invention.

A transducer 200 may be affixed or positioned in the acoustic wave cavity portion of the bar 100. For example, the transducer 200 may be positioned in an indentation, notch, groove or other area on a side of the acoustic cavity of the bar 100. FIG. 2 shows a side view of the transducer 200 positioned with respect to the bar 100. FIG. 3 depicts an end view of the transducer 200 positioned with respect to the bar 100. In an embodiment, the bar 100 operates in a very wide frequency range, such as 50 kHz to 3 MHz, with proper selection of transducer. The transducer 200 may be affixed or otherwise positioned with respect to the bar 100 by gluing, such as with an epoxy, brazing, soldering and/or otherwise affixing the transducer 200 to the bar 100 while minimizing acoustic loss. The transducer 200 may be a piezoelectric element, an electromagnetic acoustic transducer (EMAT), or other transducer, for example. For example, a 30 mm thick, 0.5 inch long, 30 mm wide piezoelectric transducer formed of a lead, zirconium and titanate (PZT) compound may be positioned in an indentation in the bar 100.

Figure 4:
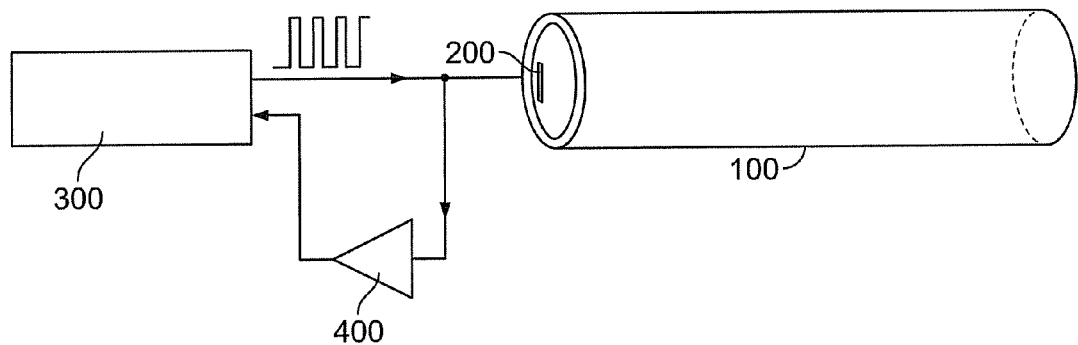
FIG. 4 illustrates a touch detection system used in accordance with an embodiment of the present invention.

FIG. 4 illustrates a touch detection system used in accordance with an embodiment of the present invention. In operation, a pulse, such as a 5 or 10 volt pulse, is applied to the transducer 200. In an embodiment, the transducer 200 may be powered by a variety of voltage(s), such as anything from 1 to 30 volts. The pulse causes the transducer 200 to vibrate or shake the metal. The vibration in the transducer 200 produces a wave, such as a torsional wave, in the bar 100. In an embodiment, the transducer 200 functions as a reciprocal transducer. That is, applying a voltage to the transducer 200 produces vibration forming a wave in the bar 100. Additionally, receiving vibration at the transducer 200 produces a voltage output. Using the transducer 200, an acoustic cavity is formed in the bar 100, and a change in signal response is detected by a touch detection circuit 300 to indicate a touch on the bar 100. After the transducer 200 is "pinged", the detection circuit 300 waits for a calculated or predefined delay time with an amplifier 400 disabled. After the delay has passed, the amplifier 400 is enabled, and pulses returned to the transducer 200 are counted. Pulses may be counted for a certain amount of time to ensure the pulse has dropped below a voltage threshold. Then, the pulse count is examined to determine whether the count is below a count threshold. Then, a touch on the bar 100 is validated. An output signal may be generated of either polarity (i.e., up on a touch or down on a touch) to notify an external system that the bar 100 has been touched. In an embodiment, the output is adjusted based on the input voltage range.

Feedback indicating that a touch has been detected at the bar 100 may be provided in a plurality of ways. For example, the detection circuit 300 may actuate a beeper or the like to provide sound feedback to a user that a touch has actuated the bar 100. Alternatively, the detection circuit 300 may actuate a light or the like to provide a visual indication of a touch. Additionally, the detection circuit 300 may actuate or alert an external system, such as an opening or closing mechanism or the like, in response to a touch.

In a metal, a cutoff frequency may be inversely proportional to a thickness of the metal. If the metal is excited in a thicker region at a frequency below the cutoff in a thinner region, a resulting acoustic wave may be trapped in a thicker region of the metal. The frequency may be adjusted to create a standing wave in the thicker region. A standing wave may be generated regardless of distance. In an embodiment, an overtone is used rather than a fundamental frequency to create a standing wave below the cutoff frequency. The standing wave is formed by the transducer 200 in an acoustic cavity created in the bar 100.

Certain embodiments of the present invention may use any type of acoustic wave capable of being substantially trapped in an acoustic wave cavity. For purposes of illustration only, a torsional wave is used in the following description. A torsional wave may be generated through the length of the bar 100. A torsional wave is advantageous because it is insensitive to liquids and other contaminants on the surface of the bar 100. Because the fundamental or zeroth order mode of a torsional wave may not be substantially trapped, higher order torsional wave modes are used in accordance with the present invention. It should be appreciated that because the acoustic wave is trapped, the wave is a standing wave. A standing wave has a number of advantages over an acoustic wave that propagates or travels along a path in a substrate. For example, propagating waves are not confined to the main path of propagation but can diffract off of the main path complicating touch detection. This is opposed to a standing wave which by its nature is confined to the area of the cavity. Because the acoustic wave is confined, touch detection may be easily accomplished. Further, the wave energy of a propagating wave is not stored at any location along the path. Once the wave passes a point along the path, the wave is gone. This makes timing and control critical for touch detection with propagating waves. There are no timing or control issues with a standing wave because the wave energy is stored in the cavity. Moreover, a propagating wave is not a resonating wave. As such, the wave energy decays as it travels. A standing wave is resonant so that the wave is reinforced and prolonged. As a result, the standing wave has a much greater amplitude than a wave that is not confined.

It should be appreciated that the cavity may also be operated in more than one mode in accordance with the present invention. Further, the transducer 200 need not be placed along a centerline of the acoustic cavity in the bar 100. For example, the transducer 200 may be placed on the cavity adjacent to an edge thereof. The transducer 200 may also be placed on the cavity but spaced from an edge thereof. The distance from the transducer to the cavity edge may be chosen to selectively cancel modes.

The acoustic wave cavity of the present invention has a high Q such as on the order of 400. The amount of energy absorbed by touching the surface of the acoustic cavity in the 1-5 MHz range is not particularly frequency sensitive. A light touch on the surface of the bar 100 reduces the Q by a factor of 2.5, i.e. from 400 to 160. As such, by incorporating the transducer 200 into a very basic and simple circuit, a touch on the acoustic cavity touch surface of the bar 100 may be easily detected so as to generate a signal indicating a touch. A touch on the surface of the cavity in the bar 100 absorbs acoustic energy in the cavity and results in an easily detectable drop in an output signal of the transducer 200. In the presence of a touch, the output signal of the transducer 200 drops below a threshold level set by a user or system. In the absence of touch, the signal received by the transducer 200 oscillates at a certain amplitude, and, in the presence of a touch, oscillation is dampened. By detecting the state of oscillation, a signal is generated indicating the occurrence of a touch at the bar 100.

The acoustic wave cavity traps a standing wave or a resonant acoustic wave in the cavity in the interior of the bar 100. As such, the acoustic wave cavity is an acoustic wave resonator. The cavity may be used to trap various types of acoustic waves. For example, the transducer 200 may be positioned along a centerline or diameter of the cavity to generate a trapped torsional wave of a higher mode than the zeroth order mode in the cavity of the bar 100. Such a torsional wave may also be generated by an EMAT generally aligned with the center of the bar cavity. However, one or more transducers 200 may be positioned with respect to the cavity to generate trapped or resonant acoustic waves other than torsional waves as well. It should be appreciate that certain embodiments are not limited to any particular type of resonant acoustic wave.

Figure 5:
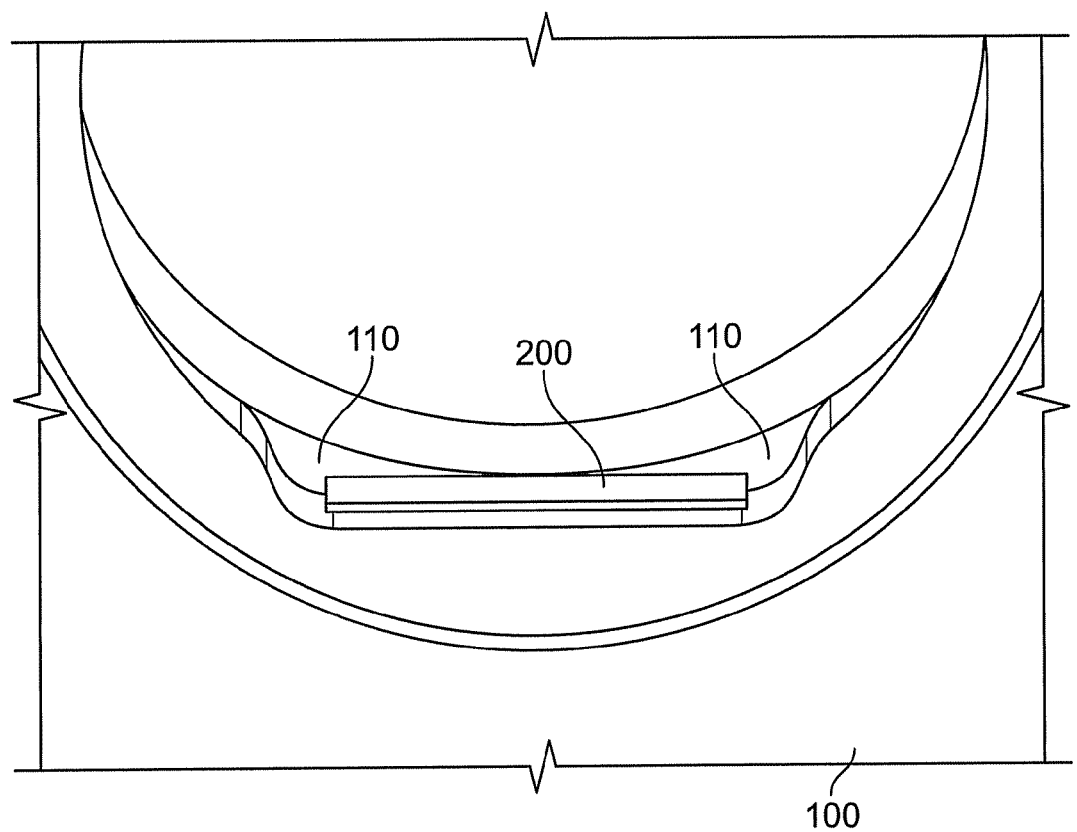
FIG. 5 depicts the transducer positioned in an acoustic cavity of a touch sensitive bar in accordance with an embodiment of the present invention.

As shown in FIG. 5, positioning the transducer 200 in an indentation 110 in the acoustic cavity portion of the bar 100 creates a resonant cavity with the overtone standing wave. Areas of reduced cross-section may be machined, carved, etched, milled, stamped, blasted, and/or otherwise formed in the bar 100 to form a resonant cavity for the standing wave. For example, portions of reduced cross-section may be machined at approximately each distal end of the bar 100 to form a resonant cavity through the length of the bar 100. Indentations, moats and/or other areas of reduced cross-section may be formed on the inside and/or outside of the bar, for example. Alternatively, material may be added along the interior and/or exterior of the bar 100 to form a resonant cavity.

Figure 6:
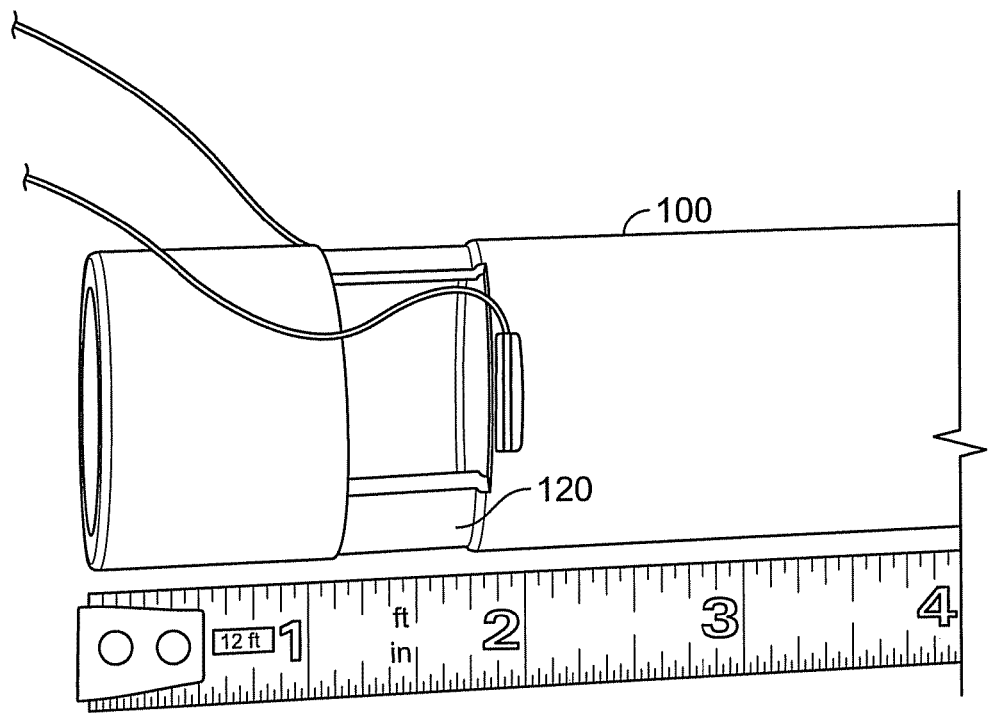
FIG. 6 illustrates an example of a reduced cross-section machined on the exterior of a touch sensitive bar in accordance with an embodiment of the present invention.
Figure 7:
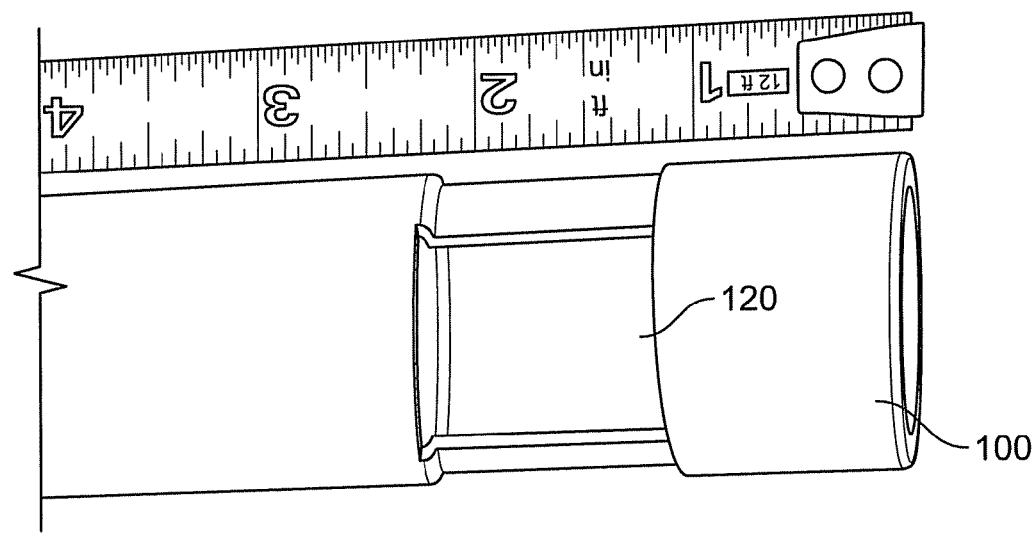
FIG. 7 illustrates an example of a reduced cross-section machined on the exterior of a touch sensitive bar in accordance with an embodiment of the present invention.
Figure 8:
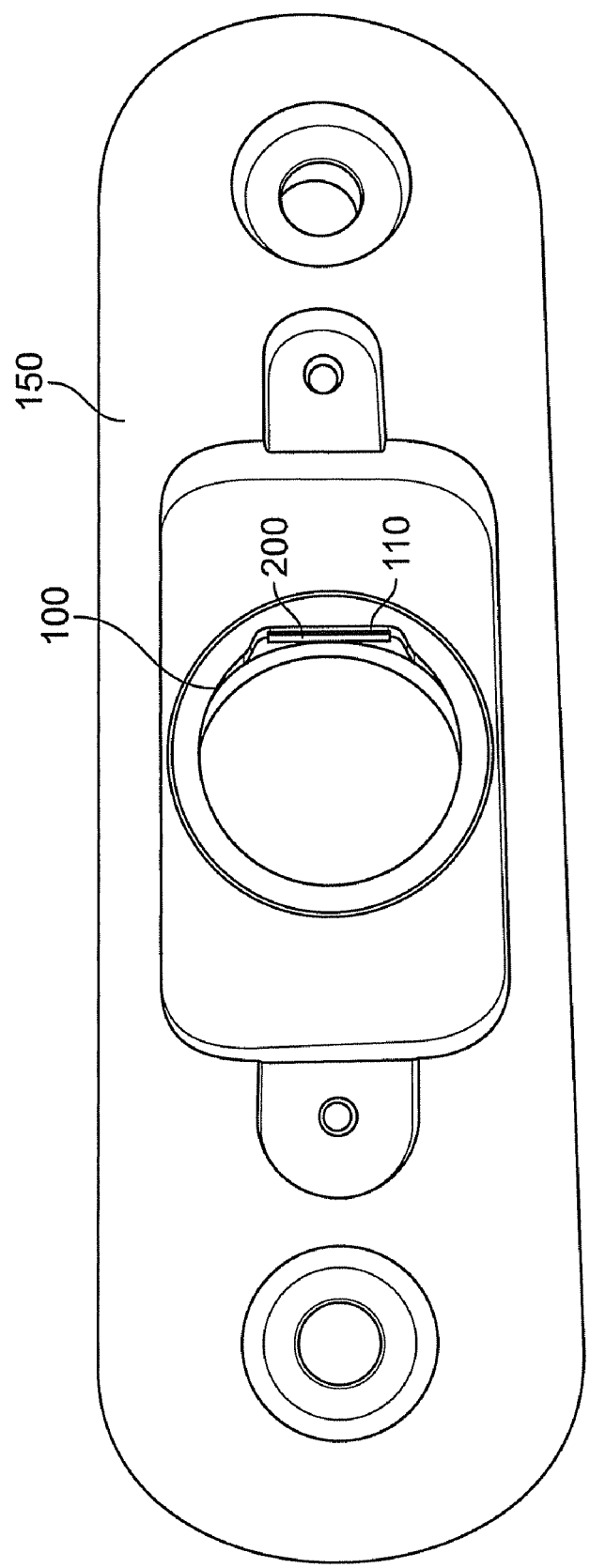
FIG. 8 depicts an end piece or flange that may be used to connect a touch sensitive bar to a surface in accordance with an embodiment of the present invention.

FIGS. 6 and 7 illustrate examples of a reduced cross-section 120 machined on the exterior of the bar 100 near the end of the bar 100. For purposes of illustration only, the reduced cross-section 120 depicted in FIGS. 6 and 7 is one inch long and 20 thousandths of an inch deep, but the reduced cross-section 120 may be any of a plurality of widths and depths depending upon the application, materials, and/or other environmental considerations. As shown in FIG. 6, wires or other connection media may be used to connect the transducer 200 to a detection circuit 300 or other external system, for example. FIG. 8 depicts an end piece or connector 150 that may be used to connect the bar 100 to a surface, such as a wall or door. The connector 150 may hide connections between the transducer 200 and the detection circuit 300 and/or external system, for example.

Characteristics of the transducer switch may be controlled by software, firmware, and/or hardware. A microprocessor or other detection circuit may be programmed or otherwise configured to provide the transducer switch with its characteristics. The detection circuit may perform noise reduction and/or other signal processing to allow machining of the bar 100 and transducer to be imprecise, for example. In an embodiment, the transducer switch and detection circuit may be monitored and dynamically adjusted to help ensure reliable operation.

In an embodiment, the transducer produces a standing wave in an acoustic cavity in the bar 100. The transducer receives feedback as a result of the standing wave as well. The exponentially decaying response of the standing wave may be monitoring using a microprocessor, microcontroller, and/or other detection circuit, for example. In certain embodiments, a detection circuit may be used to monitor or poll an acoustic wave, such as a torsional wave, in the bar 100. The circuit may monitor the bar 100 using one or more passes to detect a change in the wave. For example, 30 to 60 passes may be measured to determine a touch on the bar 100 using the acoustic wave. The detection circuit counts a number of periods or passes to reach a voltage threshold (e.g., 100 passes to reach 200 mV). When the bar 100, is touched, the exponentially decaying response decreases and the count detected by the detection circuit also decreases (i.e., the voltage threshold is reached more quickly).

Pulses may be transmitted individually and/or in bursts, such as a burst of ten pulses, to reduce noise effects. Pulse characteristics may be predefined, such as by a number of pulses per burst and frequency of bursts. For example, bursts of seven pulses triggered every 13 milliseconds may be defined. The pulse configuration may be adjusted depending upon application and operating conditions, for example.

In an embodiment, the detection circuit waits for a certain delay before examining a certain window of the signal count. The window may be static and/or may shift depending upon application and/or operating conditions, for example. In an embodiment, for example, a "normal" threshold count is 150 is stored by the detection circuit. A touch of the bar 100 reduces the count to 30. If the count is less than a certain value, N, then, a signal count difference or "window", delta N, increases. For example, if $N_U$ represents an untouched count and $N_C$ represents a current count, then $\Delta N = N_U - N_C$. If delta N exceeds a certain number, then a touch is detected. If a touch is detected, a signal is transmitted alerting an external system to the touch, for example.

In an embodiment, delta N is adjusted to compensate for a change in an untouched count for the bar 100. For example, if the count transitions from a high number to a low number, then a touch is indicated. If the count transitions from a low number to a high number, a touch has been removed and another untouch count may be determined. The window delta N may be changed depending upon the untouch count to maintain or change a sensitivity level of the detection circuit. If the bar 100 registers a touch for more than a certain number of minutes, the circuit may assume that the bar 100 is actually untouched but conditions have changed, and a new count threshold N may be determined. In an embodiment, sensitivity may be adjusted based on a desired application of the touch sensitive bar 100.

In an embodiment, the transducer switch circuit is self-diagnostic to help ensure reliability of the switch. The detection circuit may track the count, N, to help ensure that the count remains above a certain number. The detection circuit may send a signal to a main processor indicating the status of the detection circuit and/or transducer switch. A low count, a rapidly changing count, an absence of a count signal, an absence of exponential decay, and/or a receipt of an error signal notifies the main processor that an error has occurred with the transducer, such as a broken transducer connection, dislocated or loose transducer, or other circuit error.

In an embodiment, the count N may be tracked over time. If N decreases at a certain rate, a signal may be transmitted indicating that the transducer switch is failing and maintenance is desirable. Thus, the transducer switch and detection circuit may accommodate predictive failure analysis.

As a number of excitation pulses generated by the transducer increases, the strength of the signal increases. Increasing signal strength may be used to compensate for manufacturing variations in the switch. Additionally, variations in temperature and metal thickness may alter the resonant frequency for the bar 100. In an embodiment, a sinc function (sine x over x, or a Fourier transform of the excitation pulse) may be determined broadly enough such that the range will not change much even if the resonant frequency changes. As the number of pulses generated by the transducer increases, the sharper the sine x over x function becomes. Certain embodiments compensate for signal amplitude by increasing a number of pulses generated.

In an embodiment, the detection circuit examines the signal count after a certain delay has passed. An average count or acoustic cavity value may be centered at a given value, such as A0 hex. Then, the delay may be adjusted to optimize the count. The optimum delay may vary depending upon the time of operation (e.g., at system startup versus after hours of operation). The delay may be monitored and/or periodically recalculated to accommodate changing conditions. For example, if a touch count value stays below a precalculated threshold for more than a certain time period (e.g., more than 5 minutes) indicating a touch, then the delay is recalibrated to account for an incorrect touch indication. Additionally, for example, if the touch value stays above a certain threshold for a certain time period (e.g., approximately 3.5 seconds), then the delay is recalibrated.

Similarly, the average cavity value or count may be periodically examined to adjust the threshold N. When the average cavity value changes, a new touch count threshold is determined. Additionally, a new threshold may be determined periodically (e.g., every ten scans) to help ensure that the threshold is valid. In an embodiment, an average touch count is calculated in a substantially continuous manner (i.e., a running average).

The cavity window delta N may be similarly monitored and adjusted. The time window delta N attempts to maintain a tight range around the average count to allow the system to operate quickly. In an embodiment, two criteria may be applied to calibration of the cavity window. For example, the cavity window may be verified and adjusted once every ten scans if the cavity value falls inside a small window. The cavity window may be verified and adjusted once every fifty scans depending upon how far away the cavity value is from the threshold value.

After a certain period of time following system initialization, system status, such as count value, time window, and delay value, may be checked by the system. If system status satisfies one or more criteria, then the delay value is saved. If system status is not satisfactory, then the system waits another delay period and re-checks the system status. The system may iterate until values fall within acceptable limits for system operation. The system may be adjusted and monitored until desired operation is achieved. For example, the system may be heavily calibrated at start-up and then lightly recalibrated during normal operation to help ensure that the touch detection system is operating within desired limits.

Figure 9:
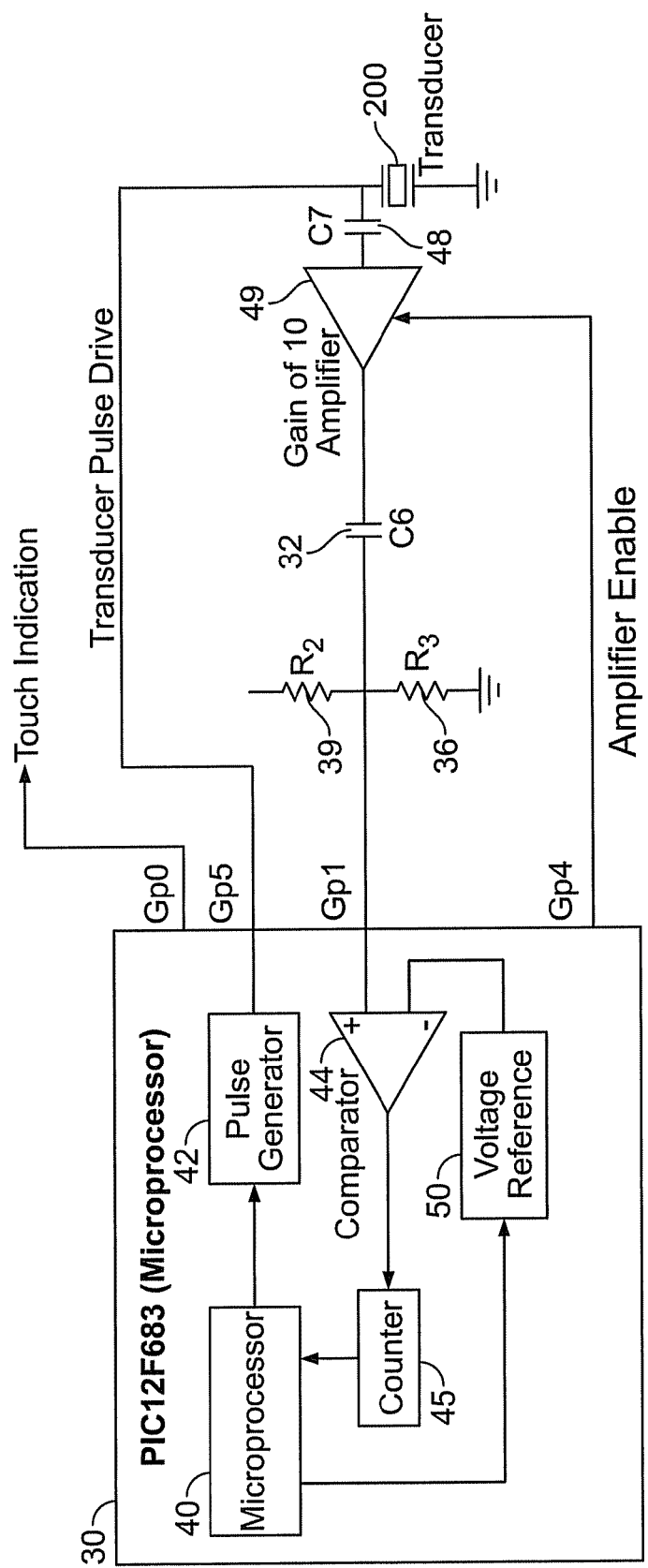
FIG. 9 illustrates a touch detection circuit used in accordance with an embodiment of the present invention.

FIG. 9 illustrates an example of a touch detection circuit 10 used in accordance with an embodiment of the present invention. The circuit 10 includes an acoustic wave transducer 200 that is coupled to an amplifier 49. In an embodiment, the amplifier 49 is a gain of 10 amplifier, for example. A capacitor 48 is connected between the transducer 200 and the amplifier 49. An output of the amplifier 49 is coupled to the controller 30. A capacitor 32 is connected between the amplifier output and a pair of resistors 36 and 39. The resistors 36, 39 set a direct current (DC) level of the transducer signal. A controller 30 drives the transducer 200 to generate an acoustic wave signal in the acoustic cavity of the bar 100 in a first portion of a sampling interval. In a second portion of the sampling interval, the controller 30 is responsive to the amplified signal received from the transducer 200 representing the acoustic wave in the acoustic wave cavity. The controller 30 analyzes the signal for a sensed event, such as a touch on the bar 100 by a member, material, composition, liquid, etc. The circuit 10 may be mounted on or in the bar 100 with the transducer 200 or may be positioned external to the bar 100 in communication or connection with the transducer 200.

The controller 30 may be a microcontroller, such as a PIC12F683 microcontroller, or other microprocessor or circuit. The controller 30 includes a microprocessor 40 with associated memory, a pulse generator 42, a comparator 44 and a timer or counter 45. The amplifier 49 increases the amplitude of the transducer 200 signal to a suitable level usable by the controller 30. Under control of the microprocessor 40, the pulse generator 42 outputs one or more drive pulses to the transducer 200 to generate a resonant standing acoustic wave in the acoustic wave cavity. The signal from the transducer 200 representing the acoustic wave in the acoustic wave cavity may be amplified and transmitted to the comparator 44 for comparison to a voltage reference 50.

The transducer 200 may be driven by one pulse from the controller 30 in the first portion of the sampling interval. Alternatively, the transducer 200 may be driven by multiple pulses, in which case the pulse frequency should be within ten to fifteen percent of the resonant frequency of the bar 100 acoustic cavity. Preferably, the pulse frequency is within plus or minus five percent of the cavity's resonant frequency. During this first interval, the amplifier 49 is disabled to prevent overdrive as a signal (e.g., a 5 volt signal) is applied to the input of the amplifier 49.

Figure 10:
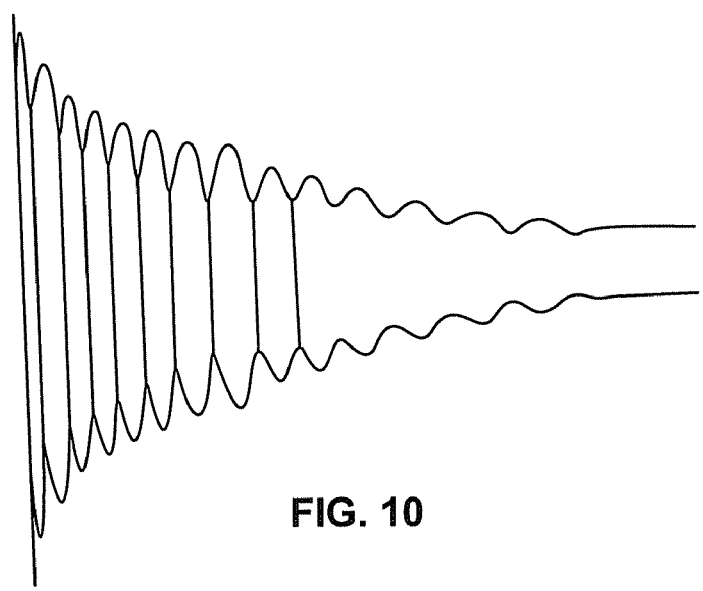
FIG. 10 depicts an acoustic wave in an untouched acoustic wave cavity that is driven by one or several pulses.
Figure 11:
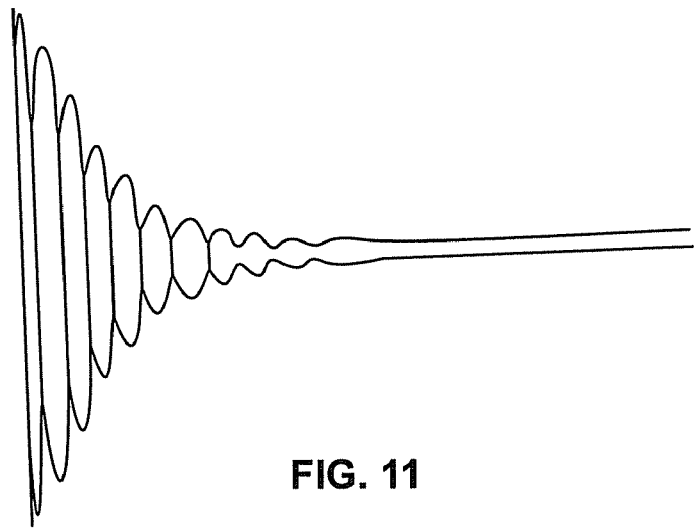
FIG. 11 illustrates a transducer signal representing an acoustic wave in an acoustic wave cavity that is touched by a synthetic blend glove.
Figure 12:
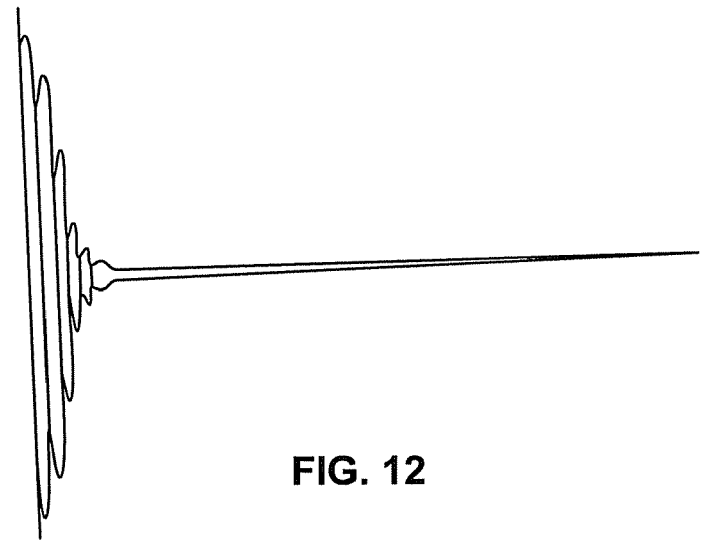
FIG. 12 illustrates a transducer signal representing an acoustic wave in an acoustic wave cavity touched by a finger.

When the transducer 200 is driven by one or several drive pulses to generate a resonant acoustic wave in the cavity, after the drive pulses cease to be applied to the transducer 200, the acoustic wave continues to resonate in the cavity but the amplitude of the wave gradually decreases over time. The voltage across the transducer 200, representing the acoustic wave in an untouched acoustic wave cavity that is driven by one or several pulses, is depicted in FIG. 10. FIG. 11 illustrates the transducer signal representing the acoustic wave in an acoustic wave cavity that is touched by a synthetic blend glove. FIG. 12 illustrates the transducer signal representing the acoustic wave in an acoustic wave cavity touched by a finger. As can be seen from FIGS. 10-12, the acoustic wave signal in an acoustic wave cavity that has been touched (FIGS. 11 and 12) decays to a predetermined level in a shorter period of time than the acoustic wave in an untouched cavity (FIG. 10). The controller 30 determines a value representing the period of time that the acoustic wave signal for a sampling interval decays to a predetermined level, and the controller 30 compares the determined value for a sampling interval to a touch reference to detect the presence of a touch on the acoustic wav cavity during the sampling interval. In an embodiment, the value representing the period of time that the acoustic wave signal decays to a predetermined level is the number of intervals of the acoustic wave signal, during a given scan count time of a sampling interval, which have an amplitude above a predetermined level.

More particularly, during the second portion of the sampling interval, the amplifier 49 is enabled by the controller 30 and amplifies the transducer 200 signal. The transducer signal is coupled to one input of the comparator 44. The comparator compares the acoustic wave signal to a predetermined reference voltage input to a second input of the comparator 44 by the microprocessor/memory 40. Preferably, the voltage reference 50 is a programmable value. The output of the comparator goes high when the acoustic wave signal is above the reference signal and the output of the comparator goes low when the acoustic wave signal falls below the reference signal. Because the acoustic wave signal is cyclical, the comparator generates an output pulse for each interval of the acoustic wave that is greater than the predetermined reference. The output of the comparator 44 is coupled to a counter 45 that counts the number of pulses generated during a scan count time as discussed in detail below. The number of pulses, representing the period of time that the acoustic wave signal decays to a predetermined level represented by the reference signal 50, is applied to the microprocessor 40. The microprocessor 40 is responsive to the number output from the counter 45 to compare that number to a second reference representing a sensed event or in the case of a touch detection circuit, a touch on the acoustic wave cavity.

Figure 13:
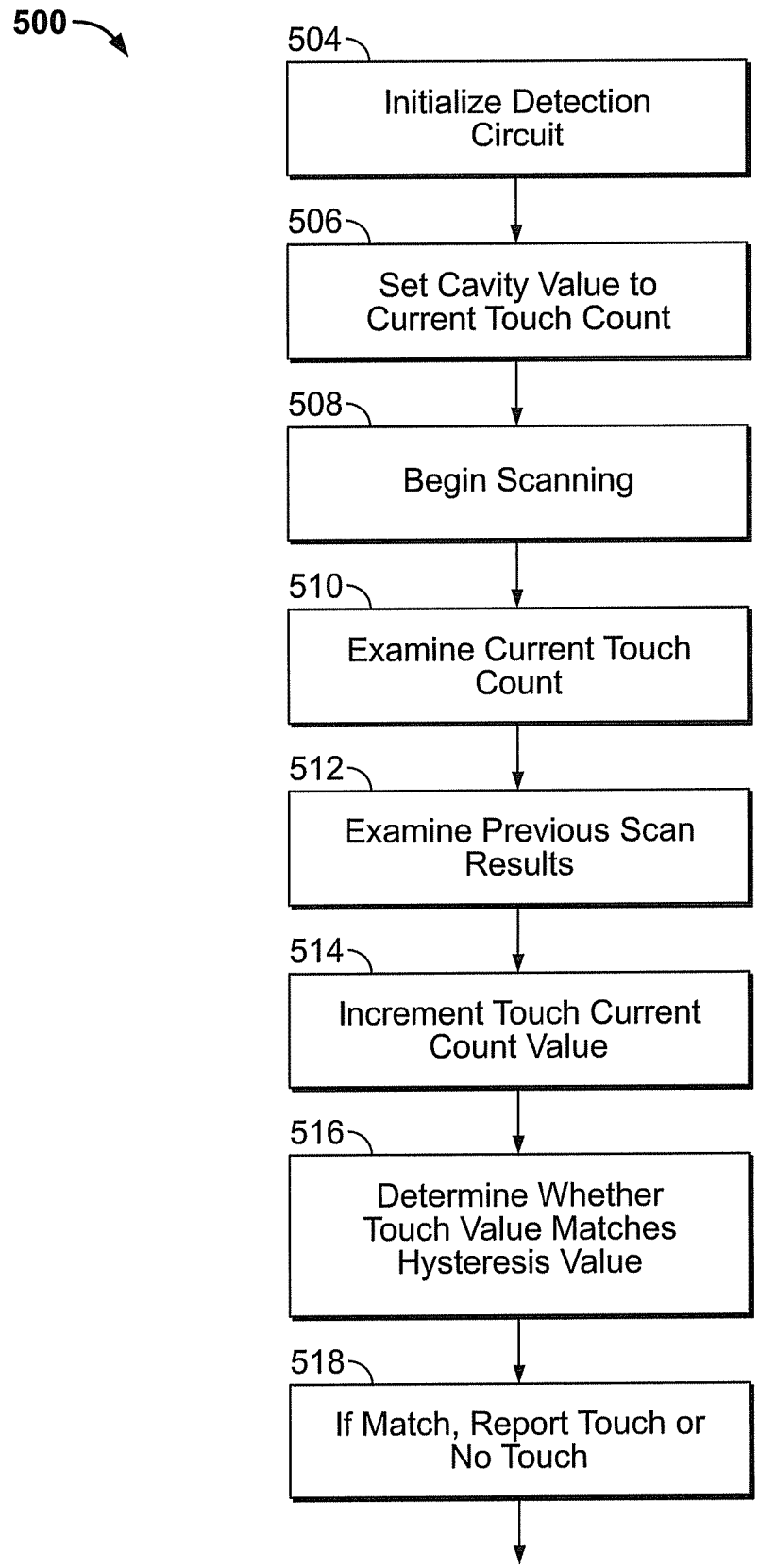
FIG. 13 depicts a flow diagram for touch detection in accordance with an embodiment of the present invention.
Figure 14:
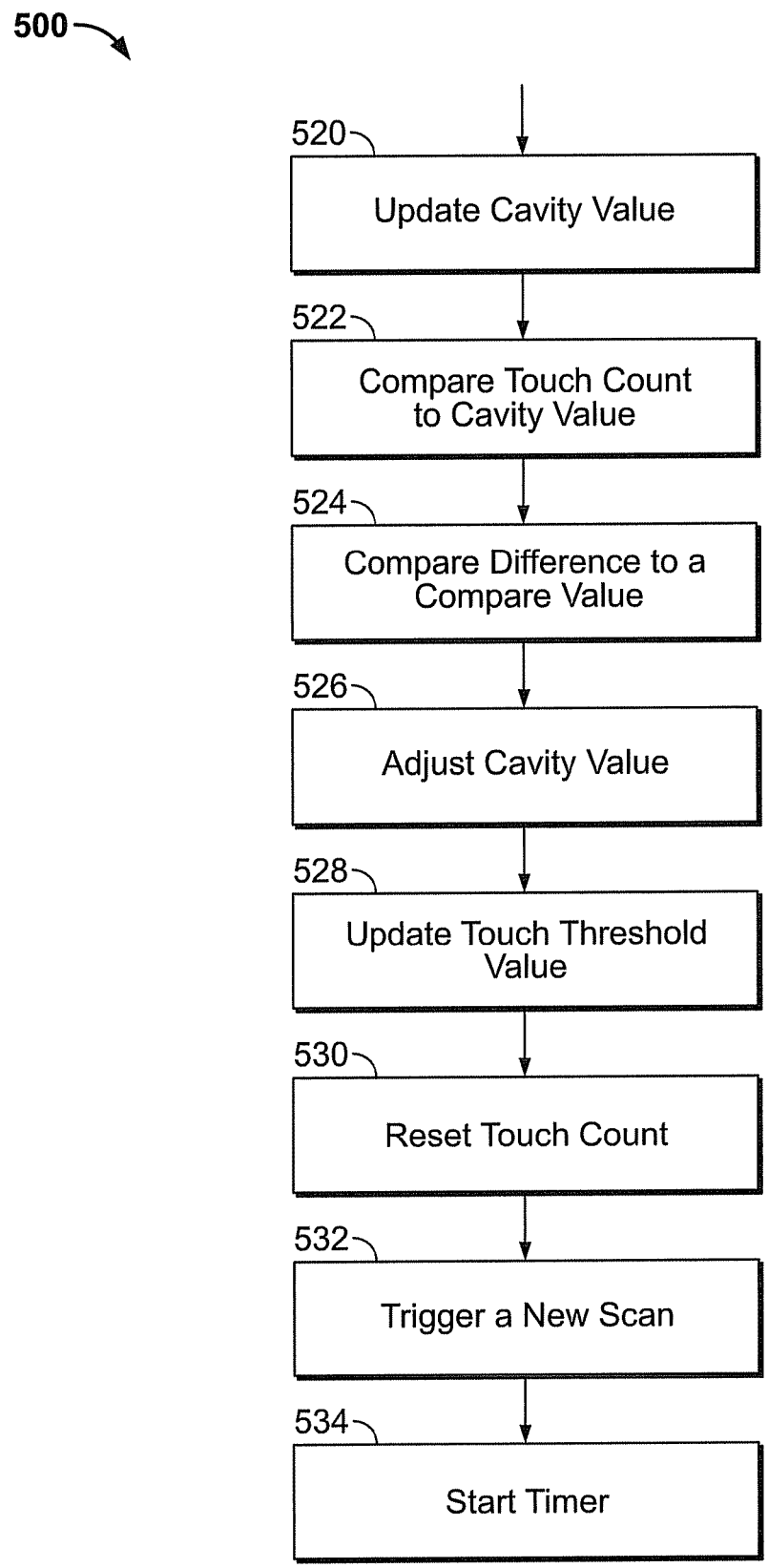
FIG. 14 depicts a flow diagram for touch detection in accordance with an embodiment of the present invention.

FIGS. 13 and 14 depict a flow diagram 500 for touch detection in accordance with an embodiment of the present application. First, at block 504, the touch detection circuit 10 is initialized. During initialization, the microprocessor 40 initializes various settings and variables. Then, the microprocessor 40 begins initialization scanning with a burst of pulses to drive the transducer 200 to generate a resonant acoustic wave in the acoustic wave cavity between indentations 120 in the bar 100. Although the transducer 200 generates a signal representing the acoustic wave in each of the scans or sampling intervals, during the initialization scanning process, the microprocessor 40 does not analyze the acoustic wave signal. The initialization scanning allows the system to stabilize when power is first turned on. In an embodiment, it is noted that each scan, i.e. sampling interval, is extremely short, being on the order of 300 microseconds to 4 milliseconds, so that the time that it takes to perform 20 scans of initialization scanning is a negligible period of time.

At block 506, a "cavity value" is set to the current "touch count." The "cavity value" represents a running average of an untouched state and is calculated as described below. The "touch count" is the count from the counter 45 generated during the scan count time for one sampling interval or scan. At block 508, scanning, i.e. sampling interval, begins. In particular, at block 508, the microprocessor 40 controls the pulse generator 42 to provide, for example, six to ten pulses to the transducer 200 so as to drive the transducer 200 to generate an acoustic wave in the acoustic wave cavity of the bar 100 for one sampling interval.

At block 510, the "touch count", i.e. a number of pulses counted by the counter 45 for a given scan, is examined. The touch count may be saved for comparison and/or adjustment of the circuit 10, for example. The microprocessor 40 determines whether the "touch count" is less than the current threshold. The current threshold is used as a touch reference. In an embodiment, a "threshold_adjust" value may be added to the current threshold to compensate for current leakage in the circuit 10. The current threshold may be a fixed value or may be determined to compensate for drift or other changes, for example. If the "touch count" value is less than the threshold, i.e. touch reference, the microprocessor 40 sets a "touch current" flag to 1. If the "touch count" value is not less than the threshold, the microprocessor 40 sets the "touch current" flag to 0.

At block 512, a certain number of previous scans are examined. For example, the microprocessor 40 determines whether the "touch count" values for ten consecutive scans or sampling periods have indicated a touch or a no touch condition. The microprocessor 40 looks for ten consecutive touch indications before registering an actual touch so as to prevent a touch from being indicated on the output Gp0 as a result of a transient contact with an acoustic wave cavity. Similarly, the microprocessor 40 looks for ten no touch indications before registering a no touch condition on Gp0 for stability of the detection process. More particularly, the microprocessor 40 determines whether the "touch current" value matches the "touch current" value from the previous scan. If so, at block 514, a touch current count value is incremented. Thereafter, at block 516, the microprocessor 40 determines whether a touch current count -matches a touch hysteresis value. The touch hysteresis value represents the number of consecutive touch values that are detected before an actual touch is reported on the output Gp0. In this example, the touch hysteresis value is set equal to ten. If the touch current value does not match the previous touch current value, the microprocessor 40 resets the touch current count. Then, the microprocessor 40 triggers a new sampling interval, i.e. a new scan, by sending out the preprogrammed number of pulses to drive the transducer 200. Similarly, if the touch hysteresis value has not been met, the microprocessor 40 triggers a new sampling interval.

At block 518, when the touch hysteresis value has been met indicating ten consecutive touch or ten consecutive no touch detections, a touch or a no touch signal is reported. For example, the microprocessor 40 provides either a touch or a no touch signal on Gp0 based on whether the ten consecutive scans indicated a touch or no touch condition.

In an embodiment, if the system is in diagnostic mode, the microprocessor 40 reports various diagnostic data, such as the current touch or no touch condition of the acoustic wave cavity; the current value of the "touch count"; the current "cavity value"; the current value of the threshold; the low side cavity count; the high side cavity count; and the "threshold adjustment". The microprocessor 40 or other external processor may also perform a variety of diagnostic tests on the circuit 10 and transducer 200. As a result of the diagnostics, a signal may be generated indicating an error.

If a touch was reported, a new scan is triggered at block 532. If the condition reported was a no touch condition, then, at block 520, the "cavity value", which represents a running average touch count value for an untouched acoustic wave cavity, is updated, so as to enable the touch threshold to be updated as well. The "cavity value" determines the threshold or touch reference to be used to detect a touch or no touch condition. The touch threshold is updated so as to compensate for drift due to changes in temperature, etc.

At block 522, the microprocessor 40 compares the "touch count" to the "cavity value." Thereafter, if the two values are not equal, the microprocessor 40 determines the cavity direction. The cavity direction is up if the current "touch count" is greater than the "cavity value", and the direction is down if the "touch count" is less than the "cavity value." The microprocessor 40 calculates the difference between the current "touch count" and the "cavity value."

At block 524, the difference between the "touch count" and the "cavity value" is compared to a "compare value". The microprocessor 40 may select a compare value, determined via a lookup table based on the cavity value or other criterion, for example. If the difference is less than the selected compare value, the microprocessor 40 increments or decrements the cavity value depending on the cavity value direction. In particular, if the cavity direction is up, the "cavity value" will be incremented. If the cavity direction is down, the "cavity value" will be decremented by one. Thus, at block 526, the "cavity value" is changed so that it represents a running average of the touch count for an untouched acoustic wave cavity. It should be apparent that other methods of generating an average of the touch count may be used as well.

At block 528, the threshold value representing the touch threshold is updated from a look up table that is associated with the material forming the acoustic wave cavity. In an embodiment, the look up table stores a number of threshold values corresponding to different "cavity values" or different cavity value ranges so that the threshold value will be selected based upon the "cavity value". In this way, the touch threshold is updated so as to account for drift caused by temperature changes, etc. It is noted that instead of using a look up table, the threshold may be a value that is calculated as a function of the "cavity value." At block 530, the "touch count" value is reset to zero in order for a new touch condition or no touch condition to be reported Gp0. If the difference calculated above between the touch count and the cavity value was greater than the "compare value" determined above, the "cavity value" and the threshold value are not updated. At block 532, a new sampling interval, i.e. a new scan, is triggered.

At block 532, the microprocessor 40 sends out a programmed number of pulses to drive the transducer 200 to generate an acoustic wave signal in the acoustic wave cavity for a scan, i.e. one sampling interval. It should be apparent that any number of pulses may be used to generate a resonant acoustic wave in the acoustic wave cavity during the first portion of the sampling interval. The microprocessor 40 controls the pulse generator 42 to output the programmed number of pulses to the transducer 200 for the first portion of a scan or sampling interval.

The microprocessor 40 loads a scan count time. The scan count time is the time during which the counter 45 is operable to count the output pulses from the comparator 44. The microprocessor 40 may clear the timer interrupt flag to allow a new interrupt to occur. The microprocessor 40 resets the counter 45. As soon as the counter 45 is reset to zero, the counter 45 starts counting the pulses output from the comparator 44. The microprocessor 40 also starts a timer for timing the scan count time. The process may be repeated upon occurrence of a timer interrupt indicating that the scan count time for the current sampling interval has been completed so that a new scan or sampling interval may be started. As discussed above, the scan count time represents the second portion of the sampling interval wherein the counter 45 is counting the pulses generated by the comparator 44.

Thus, certain embodiments provide a touch sensitive bar 100 capable of detecting a touch based on characteristics of an acoustic wave. Certain embodiments transmit standing wave pulses using a transducer and count rings or signal peaks received in return. Certain embodiments accommodate a change in delta N and/or a change in a number of pulses transmitted, for example, and receive feedback. Certain embodiments average out unusual conditions and/or excessive contact with the bar to provide a reliable switch. Certain embodiments provide a switch or indicator that is unaffected by liquid. The bar 100 may be configured to operate with a wide variation of voltage, such as from 1 to 50 volts, and/or a reversal of voltage applied to the transducer, for example. In an embodiment, if power applied to the bar 100 is lost while someone is touching the bar 100, the last untouched count may be stored so that the detection circuit is not calibrated using a touch signal when power is restored.

Certain embodiments provide a touch sensitive bar for use as an entry push bar, signal bar, or other touch detection system detecting gloved or bare-handed touch. For example, the bar may be attached vertically and/or horizontally to a door or wall, such as a commuter train or swing door, to provide notification to a system that the door should be opened or closed or some other event occur. Certain embodiments detect and report a touch anywhere along the length of the bar.

While the invention has been described with reference to one or more preferred embodiments, those skilled in the art will understand that changes may be made and equivalents may be substituted without departing from the scope of the invention. In addition, many modifications may be made to adapt a particular step, structure, or material to the teachings of the invention without departing from its scope. Therefore, it is intended that the invention not be limited to the particular embodiment disclosed, but that the invention will include all embodiments falling within the scope of the appended claims.

What is claimed is:

1. An acoustic wave touch bar system comprising:
  a bar including an acoustic cavity formed therein such that the mass per unit area of the acoustic cavity is greater than the mass per unit area of a portion of the bar adjacent the cavity and a surface of the acoustic cavity forming a touch surface for actuating the touch bar system; and an acoustic wave transducer positioned in the acoustic wave cavity of the bar, the transducer generating an acoustic wave that is substantially trapped in the acoustic cavity, wherein a touch on the touch surface of the cavity produces a detectable change in an output of the transducer.

2. The acoustic wave touch bar system of claim 1, wherein the acoustic wave generated in the bar creates a standing wave in the bar.

3. The acoustic wave touch bar system of claim 1, wherein the acoustic wave generated in the bar is a torsional wave.

4. The acoustic wave touch bar system of claim 3, wherein said transducer is a thickness torsional wave piezoelectric transducer.

5. The acoustic wave touch bar system of claim 1, wherein said bar comprises at least two portions having reduced cross-sections forming said acoustic cavity.

6. The acoustic wave touch bar system of claim 1, wherein said transducer is affixed to said bar.

7. The acoustic wave touch bar system of claim 1, wherein said output comprises an exponentially decaying response of said transducer.

8. The acoustic wave touch bar system of claim 1, wherein said bar comprises a push bar.

9. The acoustic wave touch bar system of claim 1, wherein at least a portion of the acoustic cavity is an integral part of the bar.

10. The acoustic wave touch bar system of claim 1, wherein the bar is formed of a metal or a ceramic material.

11. The acoustic wave touch bar system of claim 1, further comprising a touch detection circuit connected to said transducer.

12. The acoustic wave touch bar system of claim 11, wherein said touch detection circuit comprises a programmable microprocessor.

13. The acoustic wave touch bar system of claim 12, wherein said microprocessor is capable of dynamically recalibrating said acoustic wave touch bar system.

14. The acoustic wave touch bar system of claim 1, further comprising a connector for coupling said bar to a surface.

15. An acoustic wave touch bar system comprising:
a bar, wherein said bar includes two reduced cross-sections forming an acoustic cavity in a portion of the bar between the reduced cross-sections;
an acoustic wave transducer positioned on the acoustic wave cavity portion of the bar, wherein said transducer generates an acoustic wave that is substantially trapped in the acoustic cavity; and
a circuit coupled to said transducer and responsive to a change in a characteristic of said transducer to detect a touch on a touch surface of said bar.

16. The acoustic wave touch bar system of claim 15, wherein the acoustic wave generated by said transducer creates a standing wave in said bar.

17. The acoustic wave touch bar system of claim 15, wherein said circuit is an oscillator circuit that oscillates in the absence of a touch on the touch surface of said bar and wherein oscillation is reduced in response to a touch on the touch surface of said bar.

18. The acoustic wave touch bar system of claim 15, wherein said circuit comprises a programmable circuit.

19. The acoustic wave touch bar system of claim 18, wherein said circuit comprises an adaptive circuit dynamically adapting to a change in at least one of an application, an environment, and said characteristic of said transducer.

20. The acoustic wave touch bar system of claim 15, wherein at least a portion of the acoustic cavity is an integral part of said bar.

21. The acoustic wave touch bar system of claim 15, wherein said bar is formed from at least one of an electrostrictive material and a magnetostrictive material.

22. The acoustic wave touch bar system of claim 15, wherein said circuit is responsive to the acoustic wave to determine a number representing a period of time that the acoustic wave for a sampling interval decays to a predetermined level, and wherein the circuit compares the number for the sampling interval to a touch reference to detect a presence of a touch on the bar during the sampling interval.

23. The acoustic wave touch bar system of claim 22, wherein said circuit includes a processor and a memory, wherein the predetermined level is programmable, and wherein the processor determines the touch reference.

24. The acoustic wave touch bar system of claim 15, wherein said bar comprises a tube.

25. A method for detecting a touch on a touch responsive bar comprising:
forming two areas of reduced cross-section in the bar;
creating an acoustic wave cavity in the bar between the two areas of reduced cross-section;
creating an indentation in the acoustic wave cavity portion of the bar;
positioning a transducer in the indentation to generate an acoustic wave in the acoustic wave cavity; and
providing a touch detection signal based on a change in an output of the transducer to detect a touch on the bar.

26. A method for detecting a touch on a touch responsive bar, wherein said touch responsive bar includes a touch responsive portion, said method comprising:
generating a standing acoustic wave in the touch responsive portion of the bar;
determining a value representing the time that the acoustic wave in the touch responsive area decays to a predetermined level in an absence of a touch;
comparing the value to a reference to determine whether the subsequent value represents a touch on the touch responsive portion of the bar; and
generating a signal indicating a touch on the touch responsive portion of the bar.

27. The method of claim 26, further comprising updating the reference used to detect a touch.

28. The method of claim 27, further comprising updating the reference if the value does not represent a touch.

29. The method of claim 27, further comprising updating the reference if the value does not represent a touch and the value is different than the reference.

30. The method of claim 26, wherein the touch reference is determined based on at least one number representing a period of time that the acoustic wave signal for a sampling interval decays to a predetermined level in an absence of a touch on the touch responsive portion of the bar.

31. The method of claim 26, wherein said comparison step further comprises comparing an amplitude of the acoustic wave to a predetermined amplitude to generate a pulse when the amplitude of the acoustic wave is less than the predetermined amplitude.

32. The method of claim 26, further comprising amplifying the value for comparison to the reference to determine whether the subsequent value represents a touch on the touch responsive portion of the bar.

* * * * *